(12) United States Patent
Kim et al.

(10) Patent No.: US 11,396,596 B2
(45) Date of Patent: Jul. 26, 2022

(54) HEAT-RESISTANT RESIN COMPOSITION

(71) Applicant: LG CHEM, LTD., Seoul (KR)

(72) Inventors: Do Hyeong Kim, Daejeon (KR); Ho Namgung, Daejeon (KR); Seong Lyong Kim, Daejeon (KR); Dae San Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 182 days.

(21) Appl. No.: 16/758,746

(22) PCT Filed: Dec. 4, 2018

(86) PCT No.: PCT/KR2018/015253
§ 371 (c)(1),
(2) Date: Apr. 23, 2020

(87) PCT Pub. No.: WO2019/117524
PCT Pub. Date: Jun. 20, 2019

(65) Prior Publication Data
US 2021/0179840 A1    Jun. 17, 2021

(30) Foreign Application Priority Data

Dec. 11, 2017    (KR) ................. 10-2017-0169107
Dec. 3, 2018    (KR) ................. 10-2018-0153839

(51) Int. Cl.
| | |
|---|---|
| *C08L 55/02* | (2006.01) |
| *C08L 25/12* | (2006.01) |
| *C08L 35/06* | (2006.01) |
| *C08L 69/00* | (2006.01) |
| *C23C 14/20* | (2006.01) |
| *C23C 14/24* | (2006.01) |

(52) U.S. Cl.
CPC ............ *C08L 55/02* (2013.01); *C08L 25/12* (2013.01); *C08L 35/06* (2013.01); *C08L 69/00* (2013.01); *C08L 2201/08* (2013.01); *C08L 2205/025* (2013.01); *C08L 2205/035* (2013.01); *C23C 14/20* (2013.01); *C23C 14/24* (2013.01)

(58) Field of Classification Search
CPC ......... C08L 55/02; C08L 69/00; C08L 35/06; C08L 2205/035
See application file for complete search history.

(56) References Cited

U.S. PATENT DOCUMENTS

| | | | |
|---|---|---|---|
| 5,430,100 A | 7/1995 | Dotson et al. | |
| 10,364,329 B2 | 6/2019 | Han et al. | |
| 2002/0077392 A1 | 6/2002 | Lim et al. | |
| 2015/0368460 A1* | 12/2015 | Sohn ................ | C08L 67/02 525/64 |
| 2016/0326358 A1* | 11/2016 | Lee .................. | C08L 67/03 |
| 2017/0342223 A1 | 11/2017 | Han et al. | |

FOREIGN PATENT DOCUMENTS

| | | |
|---|---|---|
| CN | 107001746 A | 8/2017 |
| EP | 1201714 A1 | 5/2002 |
| JP | 2017502106 A | 1/2017 |
| KR | 19870007240 A | 8/1987 |
| KR | 20050088944 A | 9/2005 |
| KR | 100566769 B1 | 3/2006 |
| KR | 1020070069347 A | 7/2007 |
| KR | 20110071663 A | 6/2011 |
| KR | 101344807 B1 | 12/2013 |
| KR | 20140100301 A | 8/2014 |
| KR | 20150054770 A | 5/2015 |
| KR | 20150067743 A | 6/2015 |
| KR | 20150117402 A | 10/2015 |
| KR | 20160069116 A | 6/2016 |
| KR | 20160101997 A | 8/2016 |
| KR | 20170038604 A | 4/2017 |

OTHER PUBLICATIONS

Search Report dated Oct. 15, 2020 for European Application No. 18889010.7.

* cited by examiner

*Primary Examiner* — Jeffrey C Mullis

(57) ABSTRACT

Provided is a heat-resistant resin composition which includes: a base resin including: a graft copolymer prepared by graft polymerization of a diene-based rubber polymer with an aromatic vinyl-based monomer and a vinyl cyan-based monomer; a first styrene-based copolymer including an aromatic vinyl-based unit and a vinyl cyan-based unit; a second styrene-based copolymer including a maleimide-based unit, an aromatic vinyl-based unit, and a vinyl cyan-based unit; and a carbonate-based polymer; and a third styrene-based copolymer including an aromatic vinyl-based unit and a maleic acid-based unit.

9 Claims, No Drawings

HEAT-RESISTANT RESIN COMPOSITION

CROSS-REFERENCE TO RELATED APPLICATION

This application claims priority to and the benefit of Korean Patent Application No. 10-2017-0169107, filed on Dec. 11, 2017, and Korean Patent Application No. 10-2018-0153839, filed on Dec. 3, 2018, the disclosures of which are incorporated herein by reference in their entirety.

TECHNICAL FIELD

The present invention relates to a heat-resistant resin composition, and more particularly, to a heat-resistant resin composition with improved vacuum deposition characteristics and tensile strength.

BACKGROUND ART

An acrylonitrile-butadiene-styrene copolymer (hereinafter, referred to as "ABS copolymer") is prepared by graft polymerization of a butadiene rubber polymer with styrene and acrylonitrile. Here, the butadiene rubber polymer imparts flexibility and impact resistance to an ABS graft copolymer, and each of the styrene monomer and the acrylonitrile monomer imparts processability and rigidity, and chemical resistance to an ABS graft copolymer, respectively. Therefore, the ABS copolymer has been used in various fields including all types of electrical and electronic product housing and components, interior and exterior materials of an automobile, and miscellaneous products by adjusting the content of components according to the purpose.

Meanwhile, when the ABS copolymer is prepared by emulsion polymerization, an unreacted monomer, a coagulant, an emulsifier, or the like remains therein and appears in the form of gas at the surface of a product upon injection molding, and thus surface clarity is degraded upon deposition. In order to prevent this problem, a PC/ABS product prepared by extruding polycarbonate (PC) and the ABS copolymer together so as to harmoniously exhibit the advantages of two types of plastic has been developed. In such a PC/ABS product, PC is a main component, and the ABS copolymer is a component for enhancing fluidity and colorability. However, when PC is used as a main component in the PC/ABS product, a process temperature decreases, and chemical resistance is degraded. If the ABS copolymer is used as a main component in the PC/ABS product in order to solve this problem, compatibility between PC and the ABS copolymer is degraded, and thus impact resistance and fluidity are highly degraded.

Therefore, research is continuing on PC/ABS products which exhibit an improvement in all of moldability, chemical resistance, impact resistance, and fluidity by improving compatibility between PC and the ABS copolymer.

DISCLOSURE

Technical Problem

The present invention is directed to providing a heat-resistant resin composition with improved vacuum deposition characteristics and tensile characteristics.

Technical Solution

According to an embodiment of the present invention, there is provided a heat-resistant resin composition which includes: a base resin including: a graft copolymer prepared by graft polymerization of a diene-based rubber polymer with an aromatic vinyl-based monomer and a vinyl cyan-based monomer; a first styrene-based copolymer including an aromatic vinyl-based unit and a vinyl cyan-based unit; a second styrene-based copolymer including a maleimide-based unit, an aromatic vinyl-based unit, and a vinyl cyan-based unit; and a carbonate-based polymer; and a third styrene-based copolymer including an aromatic vinyl-based unit and a maleic acid-based unit.

According to another embodiment of the present invention, there is provided a heat-resistant resin molded article formed of the above-described heat-resistant resin composition and having a diffuse reflectance of 7.7% or less after metal deposition.

Advantageous Effects

A heat-resistant resin composition according to an embodiment of the present invention can be excellent in all of vacuum deposition characteristics, tensile characteristics, heat resistance, and impact resistance by improving compatibility between components.

MODE FOR INVENTION

Hereinafter, the present invention will be described in more detail.

Terms and words used in this specification and claims should not be interpreted as limited to commonly used meanings or meanings in dictionaries and should be interpreted with meanings and concepts which are consistent with the technological scope of the invention based on the principle that the inventors have appropriately defined concepts of terms in order to describe the invention in the best way.

In the present invention, the average particle size of a diene-based rubber polymer of a graft copolymer may be measured by dynamic light scattering, and specifically, may be measured using a scattering analyzer (Nicomp 380 manufactured by PSS Nicomp).

In the specification, an average particle size may refer to an arithmetic average particle size in the particle size distribution, that is, an average particle size in a scattering intensity distribution, as measured by dynamic light scattering.

In the present invention, a weight average molecular weight may be measured as a relative value with respect to standard polystyrene (PS) using tetrahydrofuran (THF) as an elution solvent through gel permeation chromatography (GPC; Waters Breeze).

In the present invention, the degree of grafting may be calculated by adding a predetermined amount of a graft copolymer to a solvent, followed by dissolution using a vibrator, centrifugation using a centrifuge, and drying to obtain an insoluble content, and then by using the insoluble content and the following equation. Specifically, the degree of grafting may be calculated by adding a predetermined amount of a graft copolymer to acetone; dissolving the free graft copolymer through vibration using a vibrator (trade name: SI-600R manufactured by Lab. Companion) for 24 hours; centrifuging the resultant substance using a centrifuge at 14,000 rpm for 1 hour; and drying using a vacuum dryer (trade name: DRV320DB manufactured by Advantec) at 140° C. for 2 hours to obtain an insoluble content, and then by using the insoluble content and the following equation.

$$\text{Degree of grafting (\%)} = (Y - (X \times R))/(X \times R) \times 100$$

Y: Weight of insoluble content

X: Weight of graft copolymer added upon obtaining insoluble content

R: Fraction of diene-based rubber polymer in graft copolymer added upon obtaining insoluble content In the present invention, a diffuse reflectance and a total reflectance may be measured by measuring a diffuse reflectance and a specular reflectance using a surface glossmeter (trade name: Reflectometer (TR-1100AD) manufactured by Tokyo Denshoku Co., Ltd).

In the present invention, the aromatic vinyl-based unit may be derived from an aromatic vinyl-based monomer, and the aromatic vinyl-based monomer may be one or more selected from the group consisting of styrene, α-methylstyrene, α-ethylstyrene, and p-methylstyrene.

In the present invention, the vinyl cyan-based unit may be derived from a vinyl cyan-based monomer, and the vinyl cyan-based monomer may be one or more selected from the group consisting of acrylonitrile, methacrylonitrile, phenylacrylonitrile, and α-chloroacrylonitrile.

In the present invention, the maleimide-based unit may be derived from a maleimide-based monomer, and the maleimide-based monomer may be one or more selected from the group consisting of maleimide, N-methylmaleimide, N-ethylmaleimide, N-propylmaleimide, N-isopropylmaleimide, N-butylmaleimide, N-isobutylmaleimide, N-t-butylmaleimide, N-laurylmaleimide, N-cyclohexylmaleimide, N-phenylmaleimide, N-(4-chlorophenyl)maleimide, 2-methyl-N-phenylmaleimide, N-(4-bromophenyl)maleimide, N-(4-nitrophenyl)maleimide, N-(4-hydroxyphenyl)maleimide, N-(4-methoxyphenyl)maleimide, N-(4-carboxyphenyl)maleimide, and N-benzylmaleimide.

In the present invention, the maleic acid-based unit may be derived from a maleic acid-based monomer, and the maleic acid-based monomer may be one or more selected from the group consisting of maleic anhydride, maleic acid, maleic monoester, and maleic diester.

1. Heat-Resistant Resin Composition

A heat-resistant resin composition according to an embodiment of the present invention includes 1) a base resin including: a graft copolymer prepared by graft polymerization of a diene-based rubber polymer with an aromatic vinyl-based monomer and a vinyl cyan-based monomer; a first styrene-based copolymer including an aromatic vinyl-based unit and a vinyl cyan-based unit; a second styrene-based copolymer including a maleimide-based unit, an aromatic vinyl-based unit, and a vinyl cyan-based unit; and a carbonate-based polymer: and 2) a third styrene-based copolymer including an aromatic vinyl-based unit and a maleic acid-based unit.

In addition, the heat-resistant resin composition according to an embodiment of the present invention may further include 3) a fourth styrene-based copolymer including a unit derived from an aromatic vinyl-based monomer and a unit derived from a vinyl cyan-based monomer and having a lower weight average molecular weight than that of the first styrene-based copolymer.

Hereinafter, each component of the heat-resistant resin composition according to an embodiment of the present invention will be described in detail.

1) Base Resin

The base resin includes (1) a graft copolymer prepared by graft polymerization of a diene-based rubber polymer with an aromatic vinyl-based monomer and a vinyl cyan-based monomer; (2) a first styrene-based copolymer including an aromatic vinyl-based unit and a vinyl cyan-based unit; (3) a second styrene-based copolymer including a maleimide-based unit, an aromatic vinyl-based unit, and a vinyl cyan-based unit; and (4) a carbonate-based polymer.

The base resin may significantly improve heat resistance, tensile strength, tensile elongation, and surface characteristics of the heat-resistant resin composition by including both (3) the second styrene-based copolymer and (4) the carbonate-based polymer.

However, when the base resin does not include any one of (3) the second styrene-based copolymer and (4) the carbonate-based polymer, heat resistance, tensile strength, tensile elongation, and surface characteristics of the heat-resistant resin composition are degraded. In particular, when the base resin does not include (3) the second styrene-based copolymer, heat resistance, tensile strength, tensile elongation, and surface characteristics may be significantly degraded.

(1) Graft Copolymer

The graft copolymer is prepared by graft polymerization of a diene-based rubber polymer with an aromatic vinyl-based monomer and a vinyl cyan-based monomer, and may impart excellent chemical resistance, impact resistance, and moldability to the heat-resistant resin composition.

The diene-based rubber polymer may be prepared by polymerizing, specifically, cross-linking a conjugated diene-based monomer. The conjugated diene-based monomer may be one or more selected from the group consisting of 1,3-butadiene, isoprene, chloroprene, and piperylene, and, among these compounds, 1,3-butadiene is preferred.

The diene-based rubber polymer may have an average particle size of 100 to 800 nm, 200 to 700 nm, or 300 to 600 nm, and preferably has an average particle size of 300 to 600 nm. When the average particle size of the diene-based rubber polymer falls within the above range, the graft copolymer may attain further improved mechanical properties, specifically, impact resistance.

The degree of grafting for the graft copolymer may be 10 to 60%, 20 to 50%, or 30 to 40%, and preferably is 30 to 40%. When the degree of grafting for the graft copolymer falls within the above range, thermal stability and mechanical properties of the graft copolymer are harmoniously realized.

The graft copolymer may be an acrylonitrile-butadiene-styrene copolymer.

Meanwhile, the graft copolymer may be prepared by adding a diene-based rubber polymer, an aromatic vinyl-based monomer, and a vinyl cyan-based monomer to a reactor and performing polymerization through one or more methods selected from the group consisting of emulsion polymerization, suspension polymerization, and bulk polymerization, and, among these methods, emulsion polymerization is preferably used.

The diene-based rubber polymer may be included in an amount of 45 to 75 parts by weight, 50 to 70 parts by weight, or 55 to 65 parts by weight with respect to 100 parts by weight of the sum of the diene-based rubber polymer, the aromatic vinyl-based monomer, and the vinyl cyan-based monomer added upon the preparation of the graft copolymer, and is preferably included in an amount of 55 to 65 parts by weight. When the content of the diene-based rubber polymer falls within the above range, the graft copolymer may attain further improved impact resistance and moldability.

The aromatic vinyl-based monomer may be included in an amount of 15 to 45 parts by weight, 20 to 40 parts by weight, or 25 to 35 parts by weight with respect to 100 parts by weight of the sum of the diene-based rubber polymer, the aromatic vinyl-based monomer, and the vinyl cyan-based monomer added upon the preparation of the graft copolymer, and is preferably included in an amount of 25 to 35 parts by weight. When the content of the aromatic vinyl-based monomer falls within the above range, the heat-resistant resin composition may attain further improved moldability, rigidity, and chemical resistance. Also, compatibility between the graft copolymer and the first styrene-based copolymer may be further improved.

The vinyl cyan-based monomer may be included in an amount of 1 to 20 parts by weight, 3 to 17 parts by weight, or 5 to 12 parts by weight with respect to 100 parts by weight of the sum of the diene-based rubber polymer, the aromatic vinyl-based monomer, and the vinyl cyan-based monomer added upon the preparation of the graft copolymer, and is preferably included in an amount of 5 to 12 parts by weight. When the content of the vinyl cyan-based monomer falls within the above range, the heat-resistant resin composition may attain further improved moldability, rigidity, and chemical resistance.

The graft copolymer may be included in an amount of 10 to 40 parts by weight, 15 to 35 parts by weight, or 20 to 30 parts by weight with respect to 100 parts by weight of the base resin, and is preferably included in an amount of 20 to 30 parts by weight. When the content of the graft copolymer falls within the above range, the heat-resistant resin composition may attain further improved impact resistance, moldability, and chemical resistance.

(2) First Styrene-Based Copolymer

The first styrene-based copolymer includes an aromatic vinyl-based unit and a vinyl cyan-based unit.

The first styrene-based copolymer may be included to harmoniously realize properties, that is, mechanical properties, fluidity, and heat resistance of the heat-resistant resin composition.

The first styrene-based copolymer may be a copolymer prepared using a monomer mixture including an aromatic vinyl-based monomer and a vinyl cyan-based monomer. Preferably, the first styrene-based copolymer is a copolymer prepared by polymerizing the monomer mixture through one or more methods selected from the group consisting of emulsion polymerization, suspension polymerization, and bulk polymerization, and more preferably, is a copolymer prepared by polymerizing the monomer mixture through emulsion polymerization.

The monomer mixture may include the aromatic vinyl-based monomer and the vinyl cyan-based monomer in a weight ratio of 80:20 to 60:40, 75:25 to 65:35, or 73:27 to 68:32, and preferably in a weight ratio of 73:27 to 68:32. When the weight ratio of the aromatic vinyl-based monomer and the vinyl cyan-based monomer falls within the above range, mechanical properties, fluidity, and heat resistance may be better achieved.

The first styrene-based copolymer may have a weight average molecular weight of 95,000 to 105,000 g/mol or 97,500 to 102,500 g/mol, and preferably has a weight average molecular weight of 97,500 to 102,500 g/mol. When the weight average molecular weight of the first styrene-based copolymer falls within the above range, mechanical properties, fluidity, and heat resistance may be better achieved.

The first styrene-based copolymer may be a styrene/acrylonitrile copolymer.

The first styrene-based copolymer may be included in an amount of 15 to 45 parts by weight, 20 to 40 parts by weight, or 27 to 37 parts by weight with respect to 100 parts by weight of the base resin, and is preferably included in an amount of 27 to 37 parts by weight. When the content of the first styrene-based copolymer falls within the above range, fluidity and mechanical properties of the heat-resistant resin composition may be better achieved.

(3) Second Styrene-Based Copolymer

The second styrene-based copolymer includes a maleimide-based unit, an aromatic vinyl-based unit, and a vinyl cyan-based unit.

The second styrene-based copolymer may impart excellent heat resistance to the heat-resistant resin composition.

The second styrene-based copolymer may be a copolymer prepared using a monomer mixture including a maleimide-based monomer, an aromatic vinyl-based monomer, and a vinyl cyan-based monomer. Preferably, the second styrene-based copolymer is a copolymer prepared by polymerizing the monomer mixture through one or more methods selected from the group consisting of emulsion polymerization, suspension polymerization, and bulk polymerization, and more preferably, is a copolymer prepared by polymerizing the monomer mixture through bulk polymerization.

The monomer mixture may include the maleimide-based monomer in an amount of 25 to 50 wt %, 30 to 45 wt %, or 34 to 42 wt %, and preferably in an amount of 34 to 42 wt %. When the content of the maleimide-based monomer falls within the above range, the second styrene-based copolymer may attain further improved heat resistance, and the maleimide-based monomer may be easily polymerized with the aromatic vinyl-based monomer and the vinyl cyan-based monomer.

The monomer mixture may include the aromatic vinyl-based monomer in an amount of 35 to 65 wt %, 40 to 60 wt %, or 45 to 55 wt %, and preferably in an amount of 45 to 55 wt %. When the content of the aromatic vinyl-based monomer falls within the above range, fluidity and heat resistance may be harmoniously ensured.

The monomer mixture may include the vinyl cyan-based monomer in an amount of 1 to 25 wt %, 5 to 20 wt %, or 10 to 15 wt %, and preferably in an amount of 10 to 15 wt %. When the content of the vinyl cyan-based monomer falls within the above range, compatibility between the graft copolymer and the first styrene-based copolymer increases.

The second styrene-based copolymer may have a glass transition temperature of 150 to 175° C., 155 to 170° C., or 160 to 165° C., and preferably has a glass transition temperature of 160 to 165° C. When the glass transition temperature of the second styrene-based copolymer falls within the above range, the heat-resistant resin composition may attain further improved heat resistance.

Here, the glass transition temperature may be measured by differential scanning calorimetry.

The second styrene-based copolymer may have a weight average molecular weight of 80,000 to 120,000 g/mol, 90,000 to 100,000 g/mol, or 100,000 to 110,000 g/mol, and preferably has a weight average molecular weight of 100,000 to 110,000 g/mol. When the weight average molecular weight of the second styrene-based copolymer falls within the above range, heat resistance may be improved, and fluidity may be ensured.

The second styrene-based copolymer may be an N-phenyl maleimide/styrene/acrylonitrile copolymer.

The second styrene-based copolymer may be included in an amount of 25 to 55 parts by weight, 30 to 50 parts by weight, or 35 to 45 parts by weight with respect to 100 parts by weight of the base resin, and is preferably included in an amount of 35 to 45 parts by weight. When the content of the second styrene-based copolymer falls within the above range, the heat-resistant resin composition may attain further improved heat resistance. When the content of the second styrene-based copolymer is less than the above range, heat resistance of the heat-resistant resin composition may be degraded. When the content of the second styrene-based copolymer is greater than the above range, physical properties of the heat-resistant resin composition may be degraded.

(4) Carbonate-Based Polymer

The carbonate-based polymer includes a unit derived from a carbonate-based monomer. The carbonate-based polymer may be polycarbonate.

The carbonate-based polymer may impart excellent tensile characteristics and surface characteristics to the heat-resistant resin composition. Also, the carbonate-based polymer allows a heat-resistant resin molded article formed of the heat-resistant resin composition to have excellent deposition surface characteristics.

The carbonate-based polymer may have a melt flow index (300° C., 1.2 kg) of 1 to 15 g/10 min, 6 to 12 g/10 min, or 4 to 10 g/10 min, as measured in accordance with ASTM D1238, and preferably has a melt flow index of 4 to 10 g/10 min. When the melt flow index of the carbonate-based polymer falls within the above range, the heat-resistant resin composition attains improved injection moldability, and thus an injection molded article may have excellent deposition surface characteristics.

The carbonate-based polymer may have an IZOD impact strength of 10 to 20 kg·cm/cm or 12 to 18 kg·cm/cm as measured in accordance with ASTM D256, and preferably has an IZOD impact strength of 12 to 18 kg·cm/cm. In general, since impact strength and tensile strength have a tradeoff relationship, when the IZOD impact strength of the carbonate-based polymer falls within the above range, the heat-resistant resin composition may attain improved mechanical properties, specifically, improved tensile elongation and impact strength.

The carbonate-based polymer may have a weight average molecular weight of 1,000 to 100,000 g/mol, 50,000 to 100,000 g/mol, or 20,000 to 60,000 g/mol, and preferably has a weight average molecular weight of 20,000 to 60,000 g/mol. When the weight average molecular weight of the carbonate-based polymer falls within the above range, fluidity and impact strength are harmoniously and efficiently realized.

The carbonate-based polymer may be included in an amount of 1 to 20 parts by weight, 3 to 15 parts by weight, or 5 to 10 parts by weight with respect to 100 parts by weight of the base resin, and is preferably included in an amount of 5 to 10 parts by weight. When the content of the carbonate-based polymer falls within the above range, the heat-resistant resin composition may attain further improved deposition surface and tensile characteristics. When the content of the carbonate-based polymer is less than the above range, heat resistance and tensile characteristics of the heat-resistant resin composition may be degraded, and when the content of the carbonate-based polymer is greater than the above range, tensile characteristics and impact resistance of the heat-resistant resin composition may be degraded.

2) Third Styrene-Based Copolymer

The third styrene-based copolymer includes an aromatic vinyl-based unit and a maleic acid-based unit.

The third styrene-based copolymer significantly improves compatibility between the components of the base resin, and thus may significantly improve deposition surface characteristics, tensile characteristics, impact resistance, and fluidity of the heat-resistant resin composition.

The third styrene-based copolymer may be a copolymer prepared using a monomer mixture including an aromatic vinyl-based monomer and a maleic acid-based monomer. Preferably, the third styrene-based copolymer is a copolymer prepared by polymerizing the monomer mixture through one or more methods selected from the group consisting of emulsion polymerization, suspension polymerization, and bulk polymerization, and more preferably, is a copolymer prepared by polymerizing the monomer mixture through bulk polymerization.

The monomer mixture may include an aromatic vinyl-based monomer and a maleic acid-based monomer in a weight ratio of 80:20 to 50:50, 70:30 to 50:50, or 60:40 to 50:50, and preferably in a weight ratio of 60:40 to 50:50. When the weight ratio of an aromatic vinyl-based monomer and a maleic acid-based monomer falls within the above range, compatibility between the components of the base resin is improved, and thus the heat-resistant resin composition may attain further improved deposition surface characteristics, tensile characteristics, impact resistance, and fluidity.

The third styrene-based copolymer may be a styrene/maleic anhydride copolymer.

The third styrene-based copolymer may be included in an amount of 0.1 to 5 parts by weight, 0.5 to 4 parts by weight, or 1 to 3 parts by weight with respect to 100 parts by weight of the base resin, and is preferably included in an amount of 1 to 3 parts by weight. When the content of the third styrene-based copolymer falls within the above range, compatibility between the components of the base resin is improved, and thus the heat-resistant resin composition may attain further improved deposition surface characteristics, tensile characteristics, impact resistance, and fluidity. When the content of the third styrene-based copolymer is less than the above range, tensile characteristics, impact resistance, and surface characteristics may be significantly degraded, and when the content of the third styrene-based copolymer is greater than the above range, heat resistance, impact resistance, and tensile characteristics all may be degraded.

3) Fourth Styrene-Based Copolymer

The fourth styrene-based copolymer may include an aromatic vinyl-based unit and a vinyl cyan-based unit and have a lower weight average molecular weight than that of the first styrene-based copolymer.

The fourth styrene-based copolymer may be included to improve fluidity of the heat-resistant resin composition, and specifically, to impart a high melt flow index to the heat-resistant resin composition.

The fourth styrene-based copolymer may have a melt flow index (220° C., 10 kg) of greater than 90 g/10 min or greater than 90 g/10 min and 100 g/10 min or less, as measured in accordance with ASTM D1238. When the melt flow index of the fourth styrene-based copolymer falls within the above range, a higher melt flow index may be imparted to the heat-resistant resin composition, and thus a heat-resistant resin molded article formed of the heat-resistant resin composition may attain more excellent injection surface characteristics. Also, a more excellent reflectance after metal deposition may be attained due to excellent injection surface characteristics.

The fourth styrene-based copolymer may be a copolymer prepared using a monomer mixture including an aromatic vinyl-based monomer and a vinyl cyan-based monomer. Preferably, the fourth styrene-based copolymer is a copolymer prepared by polymerizing the monomer mixture through one or more methods selected from the group consisting of emulsion polymerization, suspension polymerization, and bulk polymerization, and more preferably, is a copolymer prepared by polymerizing the monomer mixture through suspension polymerization.

The fourth styrene-based copolymer may have a weight average molecular weight of 30,000 to 90,000 g/mol, 40,000 to 80,000 g/mol, or 50,000 to 70,000 g/mol, and preferably has a weight average molecular weight of 50,000 to 70,000 g/mol. When the weight average molecular weight of the fourth styrene-based copolymer falls within the above range, not only fluidity of the heat-resistant resin composition increases, but also stable production is possible upon extrusion.

The fourth styrene-based copolymer may be a styrene/acrylonitrile copolymer.

The fourth styrene-based copolymer may be included in an amount of 0.1 to 10 parts by weight, 0.5 to 7 parts by weight, or 1 to 5 parts by weight with respect to 100 parts by weight of the base resin, and is preferably included in an amount of 1 to 5 parts by weight. When the content of the fourth styrene-based copolymer falls within the above range, the heat-resistant resin composition may attain a further increased melt flow index.

The heat-resistant resin composition according to an embodiment of the present invention may further include an additive(s) such as a lubricant, an antioxidant, a plasticizer, and the like.

2. Heat-Resistant Resin Molded Article

A heat-resistant resin molded article formed of the heat-resistant resin composition according to an embodiment of the present invention may have a diffuse reflectance, after metal deposition, of 7.7% or less, preferably 7.5% or less, and more preferably 7% or less.

When the diffuse reflectance, after metal deposition, of the heat-resistant resin molded article falls within the above range, significantly excellent surface characteristics may be exhibited after metal deposition.

Hereinafter, the present invention will be described in detail with reference to embodiments so that those skilled in the art can easily carry out the present invention. However, the present invention may be realized in several different forms, and therefore, is not limited to embodiments described herein.

Preparation Example 1

70 parts by weight of styrene, 18 parts by weight of acrylonitrile, 140 parts by weight of ion exchanged water, 2.0 parts by weight of sodium dibenzenesulfonate as an emulsifier, 0.1 part by weight of sodium phosphate ($Na_3PO_4$) as an electrolyte, 0.45 part by weight of tertiary dodecyl mercaptan (TDDM) as a molecular weight controlling agent, 0.05 part by weight of t-butyl hydroperoxide as an initiator, 0.025 part by weight of dextrose, 0.05 part by weight of sodium pyrophosphate, and 0.0005 part by weight of ferrous sulfate were batch-added to a nitrogen-substituted polymerization reactor, and polymerized at a reaction temperature of 50° C. until a polymerization conversion rate reached 35%. Then, a mixed solution including 25 parts by weight of ion exchanged water, 12 parts by weight of acrylonitrile, and 0.5 part by weight of sodium dibenzenesulfonate was continuously added to the reactor at a predetermined rate. Afterward, the temperature inside the reactor was raised to 80° C., and the polymerization was then terminated when a polymerization conversion rate was 98% to prepare a copolymer latex.

Subsequently, 333 parts by weight of ion exchanged water and 3 parts by weight of calcium chloride were sequentially added to a coagulation reactor, and the temperature inside the reactor was raised to 95° C. while stirring. 100 parts by weight (based on solid content) of the copolymer latex was continuously added to the coagulation reactor at a predetermined rate for 5 minutes.

The coagulated copolymer was dehydrated in a centrifugal dehydrator at 1,800 rpm/min for 3 minutes and then dried in a fluidized bed dryer for 2 hours to prepare a SAN copolymer having a weight average molecular weight of 100,000 g/mol in the form of a powder.

EXAMPLES AND COMPARATIVE EXAMPLES

The specifications of components used in Examples and Comparative Examples below are as follows.

(A) Base Resin (A-1) Graft copolymer: DP280 manufactured by LG Chem Ltd. (a graft copolymer prepared by graft polymerization of a butadiene rubber polymer having an average particle size of 500 nm with styrene and acrylonitrile) was used.

(A-2) First styrene-based copolymer: The copolymer according to Preparation Example 1 was used.

(A-3) Second styrene-based copolymer: IPX-063 manufactured by Denka Co., Ltd. (an N-phenyl maleimide/styrene/acrylonitrile copolymer) was used.

(A-4) Carbonate-based polymer: PC 1300 manufactured by LG Chem Ltd. (polycarbonate) was used.

(B) Third styrene-based copolymer: XIBOND 100™ manufactured by Polyscope Polymers (a styrene/maleic anhydride copolymer) was used.

(C) Fourth styrene-based copolymer: EM1-200 manufactured by SUNNY FC (a styrene/acrylonitrile copolymer) was used.

(D) Lubricant: EBS manufactured by Sunku was used.

The above-described components were mixed in contents as listed in Table 1 and Table 2 below and stirred to prepare a heat-resistant resin composition.

Experimental Example 1

Each of the heat-resistant resin compositions according to Examples and Comparative Examples was added to an extrusion type kneader (cylinder temperature: 240° C.) and extruded to prepare the composition as a pellet. Then, the pellet was injected to prepare a specimen. and properties of the pellet were evaluated by methods as described below. Results thereof are shown in Table 1 and Table 2 below.

(1) HDT (° C.): measured under conditions of ¼ inch and 18.6 kgf in accordance with ASTM D648-7.

(2) Tensile strength (kg·cm/cm): measured in accordance with ASTM D638.

(3) Tensile elongation (%): measured in accordance with ASTM D638.

(4) Impact strength (kg·cm/cm): measured using a ¼-inch notched specimen in accordance with ASTM D256.

Experimental Example 2

Aluminum (Al) was vacuum-deposited on the surface of the specimen according to Experimental Example 1 using vacuum deposition equipment (trade name: High Vacuum Coating Equipment manufactured by Daehan Vacuum Engineering Co.). Properties of the specimen on which an Al film was formed were measured by a method as described below, and results thereof are shown in Table 1 and Table 2 below.

(5) Diffuse reflectance and Total reflectance (%): A diffuse reflectance and a specular reflectance were measured using a surface glossmeter (trade name: Reflectometer (TR-1100AD) manufactured by Tokyo Denshoku Co., Ltd). The total reflectance is the sum of the diffuse reflectance and the specular reflectance. Here, since the diffuse reflectance is highly affected by sensitivity to gas and surface characteristics, the state of a vacuum-deposition surface may be inferred using the diffuse reflectance.

TABLE 1

| Classification | | Examples | | | | |
|---|---|---|---|---|---|---|
| | | 1 | 2 | 3 | 4 | 5 |
| (A) Base resin (parts by weight) | (A-1) | 25 | 24 | 25 | 25 | 25 |
| | (A-2) | 30 | 28 | 37 | 30 | 30 |
| | (A-3) | 40 | 38 | 32 | 30 | 40 |
| | (A-4) | 5 | 10 | 6 | 15 | 5 |
| (B) Third styrene-based copolymer (parts by weight) | | 3 | 3 | 1.5 | 1.5 | 5 |
| (C) Fourth styrene-based copolymer (parts by weight) | | 5 | 5 | 5 | 5 | 5 |
| (D) Lubricant (parts by weight) | | 1 | 1 | 1 | 1 | 1 |
| HDT | | 116 | 117 | 112 | 110 | 115 |
| Tensile strength | | 476 | 490 | 480 | 470 | 467 |
| Tensile elongation | | 28 | 24 | 22 | 15 | 25 |
| Impact strength | | 6 | 5 | 7 | 4 | 5 |
| Diffuse reflectance | | 6 | 7 | 6.4 | 7.5 | 6 |
| Total reflectance | | 91 | 90.6 | 90.3 | 89.6 | 90 |

TABLE 2

| Classification | | Comparative Examples | | | | | | |
|---|---|---|---|---|---|---|---|---|
| | | 1 | 2 | 3 | 4 | 5 | 6 | 7 |
| (A) Base resin (parts by weight) | (A-1) | 24 | 23 | 20 | 25 | 42 | 26 | 45 |
| | (A-2) | 31 | 35 | 30 | 30 | 50 | 32 | 55 |
| | (A-3) | 35 | 37 | 30 | 40 | — | 42 | — |
| | (A-4) | 10 | 5 | 20 | 5 | 8 | — | — |
| (B) Third styrene-based copolymer (parts by weight) | | — | — | — | — | 3 | 3 | 3 |
| (C) Fourth styrene-based copolymer (parts by weight) | | 5 | 5 | 5 | 5 | 5 | 5 | 5 |
| (D) Lubricant (parts by weight) | | 1 | 0.5 | 0.5 | 1 | 1 | 1 | 1 |
| HDT | | 112 | 111 | 113 | 110 | 90 | 107 | 88 |
| Tensile strength | | 460 | 460 | 490 | 460 | 400 | 450 | 380 |
| Tensile elongation | | 0.01 | 12 | 16 | 12 | 15 | 20 | 35 |
| Impact strength | | 3.5 | 4 | 4 | 3.5 | 15 | 20 | 30 |
| Diffuse reflectance | | 8.8 | 8.5 | 8 | 8.1 | 11 | 9 | 11 |
| Total reflectance | | 84.3 | 83.4 | 87.0 | 84 | 82 | 85 | 82 |

Referring to Table 1 and Table 2, it can be confirmed that Examples 1 to 5 exhibited a high heat deflection temperature and was excellent in tensile strength, tensile elongation, impact strength, and a diffuse reflectance. Also, it can be confirmed through a comparison of Example 1 with Example 5 that, as the content of a third styrene-based copolymer increased, a heat deflection temperature was lowered, and tensile strength, tensile elongation, and impact strength were degraded. It can be confirmed through a comparison of Example 3 with Example 4 that, as the content of a carbonate-based polymer increased, a heat deflection temperature was lowered, and tensile strength, tensile elongation, impact strength, and a diffuse reflectance were degraded. From these results, it can be predicted that, only when all components are included in appropriate amounts, excellent effects may be realized. Meanwhile, it can be confirmed that Comparative Examples 1 to 4, in which a third styrene-based copolymer was not included, exhibited significant degradation of a diffuse reflectance, tensile elongation, and impact strength.

In addition, it can be confirmed that in the case of Comparative Example 5 in which a second styrene-based copolymer was not included, Comparative Example 6 in which a carbonate-based polymer was not included, and Comparative Example 7 in which both a second styrene-based copolymer and a carbonate-based polymer were not included, a heat deflection temperature was lowered, and tensile strength and tensile elongation were significantly degraded, but impact resistance was rather improved. From these results, it can be predicted that, although a second styrene-based copolymer and a carbonate-based polymer affect a heat deflection temperature, tensile characteristics, and impact resistance, the appropriate amounts of a second styrene-based copolymer and a carbonate-based polymer may minimally degrade impact resistance and may improve a heat deflection temperature and tensile characteristics.

The invention claimed is:

1. A heat-resistant resin composition comprising:
   a base resin comprising:
   a graft copolymer prepared by graft polymerization of a diene-based rubber polymer with an aromatic vinyl-based monomer and a vinyl cyan-based monomer;
   a first styrene-based copolymer comprising an aromatic vinyl-based unit and a vinyl cyan-based unit;
   a second styrene-based copolymer comprising a maleimide-based unit, an aromatic vinyl-based unit, and a vinyl cyan-based unit; and
   a carbonate-based polymer; and
   a third styrene-based copolymer comprising an aromatic vinyl-based unit and a maleic acid-based unit, wherein the third styrene-based copolymer is a styrene/maleic anhydride bipolymer.

2. The heat-resistant resin composition of claim 1, wherein the heat-resistant resin composition includes the third styrene-based copolymer in an amount of 0.1 to 5 parts by weight with respect to 100 parts by weight of the base resin.

3. The heat-resistant resin composition of claim 1, wherein the diene-based rubber polymer has an average particle size of 100 to 800 nm.

4. The heat-resistant resin composition of claim 1, wherein the first styrene-based copolymer is a styrene/acrylonitrile copolymer.

5. The heat-resistant resin composition of claim 1, wherein the second styrene-based copolymer is an N-phenylmaleimide/styrene/acrylonitrile copolymer.

6. The heat-resistant resin composition of claim 1, wherein the carbonate-based polymer is polycarbonate.

7. The heat-resistant resin composition of claim 1, wherein the heat-resistant resin composition includes, with respect to 100 parts by weight of the base resin,
   the graft copolymer in an amount of 10 to 40 parts by weight;
   the first styrene-based copolymer in an amount of 15 to 45 parts by weight;
   the second styrene-based copolymer in an amount of 25 to 55 parts by weight; and
   the carbonate-based polymer in an amount of 1 to 20 parts by weight.

8. The heat-resistant resin composition of claim 1, wherein the heat-resistant resin composition includes, with respect to 100 parts by weight of the base resin,
   the graft copolymer in an amount of 15 to 35 parts by weight;
   the first styrene-based copolymer in an amount of 20 to 40 parts by weight;
   the second styrene-based copolymer in an amount of 30 to 50 parts by weight; and the carbonate-based polymer in an amount of 3 to 15 parts by weight.

9. A heat-resistant resin molded article formed of the heat-resistant resin composition of claim 1 and having a diffuse reflectance of 7.7% or less after metal deposition.

* * * * *